United States Patent
Lin et al.

(10) Patent No.: US 9,425,157 B2
(45) Date of Patent: Aug. 23, 2016

(54) SUBSTRATE AND PACKAGE STRUCTURE

(71) Applicant: Taiwan Semiconductor Manufacturing Company Limited, Hsinchu (TW)

(72) Inventors: Wei-Hung Lin, Hsinchu County (TW); Hsiu-Jen Lin, Hsinchu County (TW); Ming-Da Cheng, Hsinchu County (TW); Yu-Min Liang, Taoyuan County (TW); Chen-Shien Chen, Hsinchu County (TW); Chung-Shi Liu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 144 days.

(21) Appl. No.: 14/190,360

(22) Filed: Feb. 26, 2014

(65) Prior Publication Data
US 2015/0243620 A1    Aug. 27, 2015

(51) Int. Cl.
*H01L 23/48*    (2006.01)
*H01L 23/00*    (2006.01)

(52) U.S. Cl.
CPC ............... *H01L 24/14* (2013.01); *H01L 24/17* (2013.01); *H01L 24/13* (2013.01); *H01L 24/16* (2013.01); *H01L 2224/0401* (2013.01); *H01L 2224/131* (2013.01); *H01L 2224/13005* (2013.01); *H01L 2224/13082* (2013.01); *H01L 2224/1403* (2013.01); *H01L 2224/16238* (2013.01); *H01L 2224/1703* (2013.01)

(58) Field of Classification Search
CPC ............ H01L 2224/3225; H01L 2224/73267; H01L 2224/8203; H01L 2224/04105; H01L 2224/24226; H01L 2224/92244; H01L 24/25; H01L 24/82; H01L 24/24
USPC .................................................. 257/737–738
See application file for complete search history.

(56) References Cited

U.S. PATENT DOCUMENTS

2006/0214297 A1* 9/2006 Moriyama .................... 257/737
2013/0228916 A1* 9/2013 Mawatari ..................... 257/737

OTHER PUBLICATIONS

Taiwanese Office Action; Application No. 103146483; dated May 24, 2016.

\* cited by examiner

*Primary Examiner* — Hoa B Trinh
(74) *Attorney, Agent, or Firm* — Jones Day

(57) ABSTRACT

According to an exemplary embodiment, a substrate having a first area and a second area is provided. The substrate includes a plurality of pads. Each of the pads has a pad size. The pad size in the first area is larger than the pad size in the second area.

17 Claims, 3 Drawing Sheets

200

SUBSTRATE AND PACKAGE STRUCTURE

BACKGROUND

For bump-on-trace technology, yield of a flip chip package may be influenced by the size or the shape of bumps and pads in the package. There is a need to carefully design the size and the shape.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
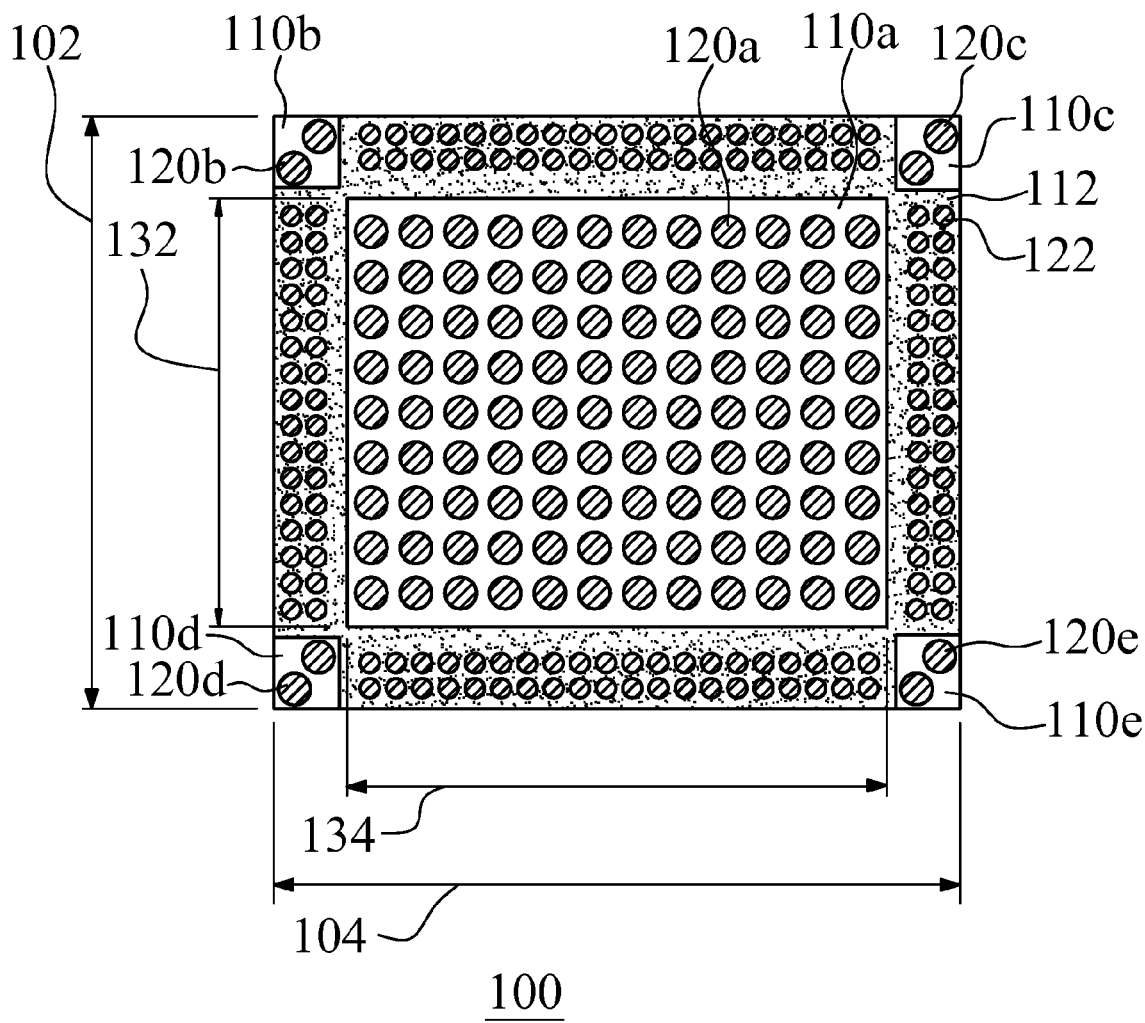
FIG. 1 is a top view illustrating an exemplar substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The disclosure describes a package structure that has a larger ratio of substrate pad sizes to chip bump sizes in (1) a core area, (2) a corner area and (3) an area with loose traces/lines, and has a smaller ratio in other areas. The larger ratio may refer to about 0.75-1.25, and the smaller may refer to about 0.5. The structure improves a bridging window between the substrate pad and the chip bump, and provides better control for reducing bump shifting to enhance the joint yield in bump-on-trace technology.

The disclosure describes a substrate that has a larger pad size in (1) a core area, (2) a corner area and (3) an area with loose traces/lines, and has a smaller pad size in other areas. The substrate improves a bridging window between the substrate pad and the chip bump, and provides better control for reducing bump shifting to enhance the joint yield in bump-on-trace technology.

FIG. 1 is a top view illustrating an exemplar substrate in accordance with some embodiments. As shown in FIG. 1, a substrate 100 has first areas 110a-110e and a second area 112. The substrate 100 includes pads 120a-120e and pad 122. The sizes of the pads 120a-120e in the first areas 110a-110e are larger than the size of the pad 122 in the second area 112. The first area 110a is a core area of the substrate 100. The first areas 110b-110e are corner areas of the substrate 100. Additionally, the first area may further include an area having loose traces (not shown). The second area 112 may include other areas in the substrate 100 except the first area 110a-110e.

The center of the core area 110a is aligned to the center of the substrate 100, the width 134 of the core area 110a is about 80% of the width 104 of the substrate 100, and the length 132 of the core area 110a is about 80% of the length 102 of the substrate 100.

The substrate 100 may increase a bridging window between the substrate pad 120a-120e and the chip bump (not shown), and provide better control for reducing bump shifting to enhance the joint yield in bump-on-trace technology.

Figure 2:
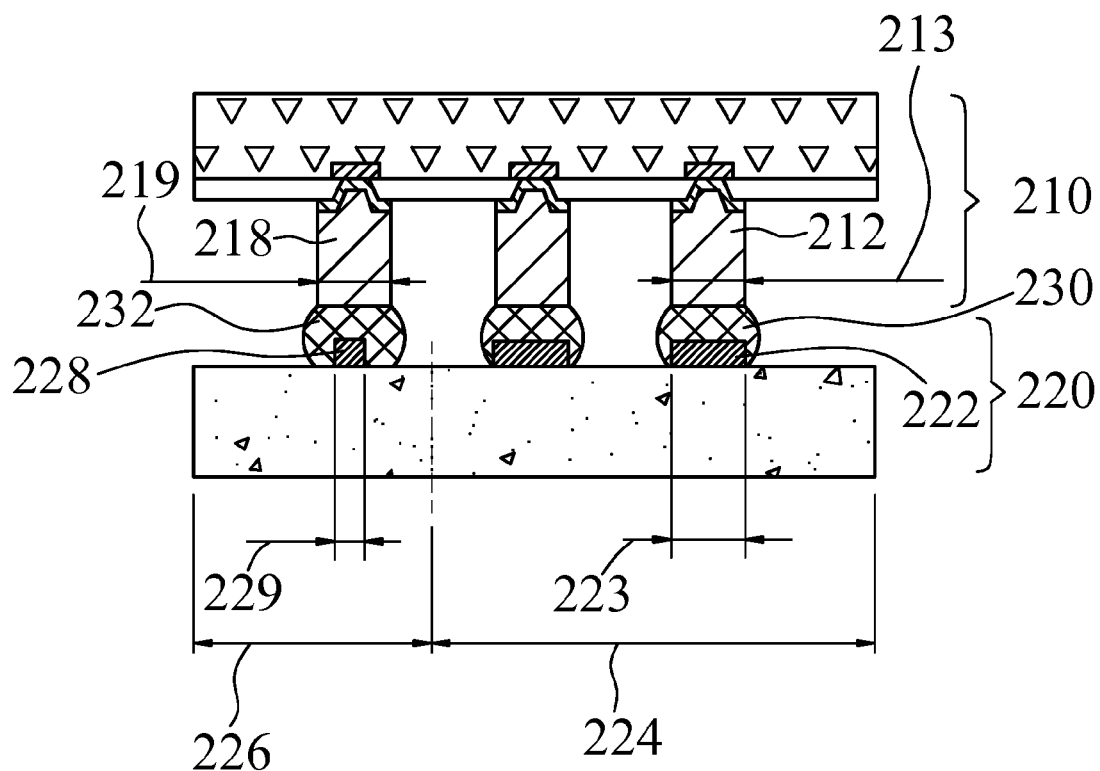
FIG. 2 is a sectional view illustrating a portion of an exemplar package structure in accordance with some embodiments.

FIG. 2 is a sectional view illustrating a portion of an exemplar package structure in accordance with some embodiments. As shown in FIG. 2, the package structure 200 includes a chip 210, a substrate 220, and solders 230, 232. The chip 210 includes bumps 212, 218. Each of the bumps 212, 218 respectively have a bump size 213, 219. The substrate 220 includes pads 222, 228. Each of the pads 222, 228 respectively has a pad size 223, 229. The solder 230 electrically connects the bump 212 to the substrate pad 222, and the solder 232 electrically connects the bump 218 to the substrate pad 228.

The substrate 220 has a first area 224 and a second area 226. The ratio of the pad size 223 to the bump size 213 in the first area 224 is larger than the ratio of the pad size 229 to the bump size 219 in the second area 226. To be more specific, the bump sizes 213, 219 may be identical, and the pad size 223 in the first area 224 is larger than the pad size 229 in the second area 226.

The ratio of the pad size 223 to the bump size 213 in the first area 224 may be about 0.75 to about 1.25. The ratio of the pad size 229 to the bump size 219 in the second area 226 may be about 0.5.

Referring to FIG. 1 and FIG. 2, the first area 224 may correspond to the core area 110a of the substrate 100, the corner area 110b-110e of the substrate 100, or an area having loose traces. The second area 226 may correspond to the edge area 112 and other areas in the substrate 100 except the first area. Additionally, the bump sizes 213, 219 may be smaller than 100 micrometer.

The package structure 200 may increase a bridging window between the substrate pad 222 and the chip bump 212, and provide better control for reducing bump shifting to enhance the joint yield in bump-on-trace technology.

Figure 3:
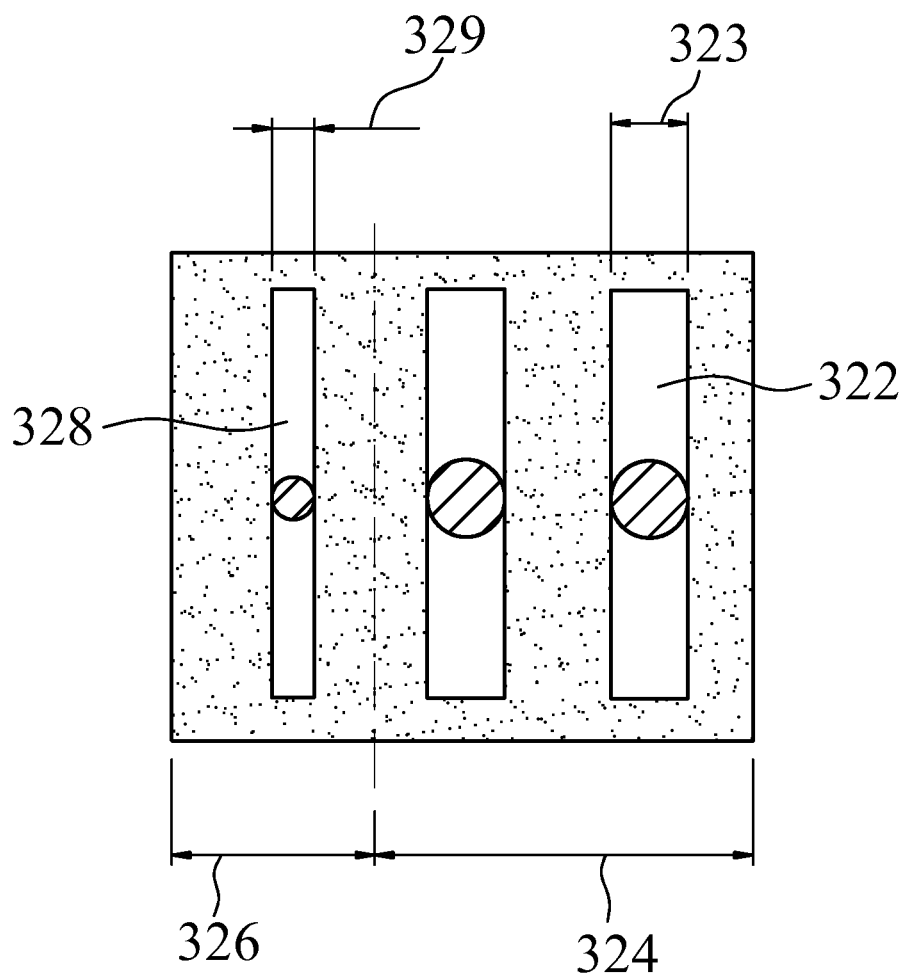
FIG. 3 is a top view illustrating a portion of an exemplar substrate in accordance with some embodiments.

FIG. 3 is a top view illustrating a portion of an exemplar substrate in accordance with some embodiments. As shown in FIG. 3, a substrate 300 has a first area 324 and a second area 326. The substrate 300 includes traces 322, 328. The width 322 of the trace 323 in the first area 324 is larger than the width 329 of the trace 328 in the second area 326.

Referring to FIG. 1 and FIG. 3, the first area 324 may correspond to the core area 110a of the substrate 100, the corner area 110b-110e of the substrate 100, or an area having loose traces. The second area 326 may correspond to other areas in the substrate 100 except the first area. Additionally, the trace widths 323, 329 are smaller than 100 micrometer.

The substrate 300 may increase a bridging window between the trace 322 and the chip bump, and provide better control for reducing bump shifting to enhance the joint yield in bump-on-trace technology.

According to an exemplary embodiment, a substrate having a first area and a second area is provided. The substrate includes a plurality of pads. Each of the plurality of pads has a pad size. The pad size in the first area is larger than the pad size in the second area.

According to an exemplary embodiment, a substrate having a first area and a second area is provided. The substrate includes a plurality of traces. Each of the plurality of traces has a trace width. The trace width in the first area is larger than the trace width in the second area.

According to an exemplary embodiment, a package structure is provided. The package structure includes a chip, a substrate and a plurality of solders. The chip includes a plurality of bumps. Each of the plurality of bumps has a bump size. The substrate has a first area and a second area is provided. The substrate includes a plurality of pads. Each of the plurality of pads has a pad size. The ratio of the pad size to the bump size in the first area is larger than the ratio of the pad size to the bump size in the second area. The plurality of solders electrically connect the plurality of bumps and the plurality of pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a chip, comprising a plurality of pillar bumps, each of the plurality of pillar bumps having a bump size;
   a substrate, having a first area and a second area, and comprising a plurality of pads, each of the plurality of pads having a pad size, wherein a ratio of the pad size to the bump size in the first area is larger than a ratio of the pad size to the bump size in the second area; and
   a plurality of solders, electrically connecting the plurality of pillar bumps and the plurality of pads.

2. The structure of claim 1, wherein the ratio of the pad size to the bump size in the first area is about 0.75 to about 1.25.

3. The structure of claim 1, wherein the ratio of the pad size to the bump size in the second area is about 0.5.

4. The structure of claim 1, wherein the first area includes a core area of the substrate.

5. The structure of claim 1, wherein the first area includes a corner area of the substrate.

6. The structure of claim 1, wherein the first area includes an area having loose traces.

7. The structure of claim 1, wherein the second area includes other area in the substrate except the first area.

8. The structure of claim 1, wherein the first area includes a core area of the substrate, a corner area of the substrate and an area having loose traces, wherein the second area includes other area in the substrate except the first area.

9. The structure of claim 8, wherein a center of the core area is aligned to the center of the substrate, a width of the core area is about 80% of a width of the substrate, and a length of the core area is about 80% of a length of the substrate.

10. The structure of claim 1, wherein the bump size is smaller than 100 micrometer.

11. A substrate having a first area and a second area, comprising:
    a plurality of pillar bumps, each of the plurality of pillar bumps having a bump size;
    a plurality of pads, each of the plurality of pads having a pad size, wherein a ratio of the pad size to the bump size in the first area is larger than a ratio of the pad size to the bump size in the second area.

12. The substrate of claim 11, wherein the first area includes a core area of the substrate.

13. The substrate of claim 11, wherein the first area includes a corner area of the substrate.

14. The substrate of claim 11, wherein the first area includes an area having loose traces.

15. The substrate of claim 11, wherein the second area includes other area in other area in the substrate except the first area.

16. The substrate of claim 11, wherein the first area includes a core area of the substrate, a corner area of the substrate and an area having loose traces, wherein the second area includes other area in the substrate except the first area.

17. The substrate of claim 16, wherein a center of the core area is aligned to the center of the substrate, a width of the core area is about 80% of a width of the substrate, and a length of the core area is about 80% of a length of the substrate.

* * * * *